United States Patent
Kang

(10) Patent No.: US 9,864,352 B2
(45) Date of Patent: Jan. 9, 2018

(54) SLICE I/O—FIELD POWER BUS BREAKER

(71) Applicant: Rockwell Automation Asia Pacific Business Ctr. Pte., Ltd., Singapore (SG)

(72) Inventor: Soon Seng Kang, Singapore (SG)

(73) Assignee: Rockwell Automation Asia Pacific Business Ctr. Pte., Ltd., Singapore (SG)

( * ) Notice: Subject to any disclaimer, the term of this patent is extended or adjusted under 35 U.S.C. 154(b) by 311 days.

(21) Appl. No.: 14/726,805

(22) Filed: Jun. 1, 2015

(65) Prior Publication Data
US 2016/0349721 A1    Dec. 1, 2016

(51) Int. Cl.
*H05K 7/14* (2006.01)
*G05B 15/02* (2006.01)
*G05F 1/66* (2006.01)
*G05B 19/05* (2006.01)

(52) U.S. Cl.
CPC ........... *G05B 15/02* (2013.01); *G05B 19/058* (2013.01); *G05F 1/66* (2013.01); *H05K 7/1478* (2013.01); *H05K 7/1482* (2013.01); *G05B 2219/15078* (2013.01); *G05B 2219/15097* (2013.01)

(58) Field of Classification Search
CPC .................. G05B 15/02; G05B 19/058; G05B 2219/15078; G05B 2219/15097; G05F 1/66; H05K 7/1478; H05K 7/1482
See application file for complete search history.

(56) References Cited

U.S. PATENT DOCUMENTS

| | | |
|---|---|---|
| 4,472,764 A | 9/1984 | Richard et al. |
| 4,985,803 A | 1/1991 | Pum et al. |
| 5,229,922 A | 7/1993 | Muramatsu et al. |

(Continued)

FOREIGN PATENT DOCUMENTS

| | | |
|---|---|---|
| DE | 89 10 111 U1 | 10/1989 |
| DE | 196 51 961 A 1 | 6/1998 |

(Continued)

OTHER PUBLICATIONS

European Search Report, dated Nov. 16, 2016, in connection with EP 16170942.3, filed May 24, 2016.

(Continued)

*Primary Examiner* — Matthew Nguyen
(74) *Attorney, Agent, or Firm* — Fay Sharpe LLP

(57) ABSTRACT

An input/output (I/O) device for an automation control system includes a device housing containing control circuitry, the device housing being mountable to a support, a control power input for receiving control power from a first adjacent I/O device when connected thereto, the control power input configured to supply control power to the control circuitry, a control power output for outputting control power to a second associated adjacent I/O device, a field power input for receiving field power from the first associated adjacent I/O device when connected thereto, and a field power output for transmitting field power to the second associated I/O device. The field power input is selectively removable to prevent field power from being received by the I/O device from the first associated adjacent I/O device when connected thereto.

20 Claims, 7 Drawing Sheets

(56) References Cited

U.S. PATENT DOCUMENTS

| | | | |
|---|---|---|---|
| 5,641,313 A * | 6/1997 | Hohorst | H01R 9/2658 439/709 |
| 5,716,241 A | 2/1998 | Hennemann | |
| 6,016,523 A | 1/2000 | Zimmerman | |
| 6,077,125 A * | 6/2000 | Emery | H01R 9/2433 439/638 |
| 6,402,569 B1 | 6/2002 | Spadoni | |
| 6,430,054 B1 | 8/2002 | Iwata | |
| 6,443,783 B1 | 9/2002 | Beadle | |
| 6,672,914 B1 | 1/2004 | Claprood | |
| 7,491,096 B1 * | 2/2009 | Correll | H01R 9/2408 439/716 |
| 2001/0021608 A1 | 9/2001 | Borbolla | |
| 2002/0050375 A1 | 5/2002 | Sumida | |
| 2002/0064976 A1 | 5/2002 | Saito | |
| 2002/0166690 A1 | 11/2002 | Chiriku | |
| 2002/0168882 A1 | 11/2002 | Chiriku | |
| 2003/0174465 A1 | 9/2003 | Isozumi | |
| 2004/0218317 A1 | 11/2004 | Kawazu | |
| 2006/0256508 A1 | 11/2006 | Kim | |
| 2007/0073912 A1 | 3/2007 | Ozaki | |
| 2007/0173079 A1 | 7/2007 | Kumar | |
| 2008/0049476 A1 | 2/2008 | Azuma | |
| 2008/0266810 A1 | 10/2008 | Tiedemann et al. | |
| 2009/0085722 A1 | 4/2009 | Fujita | |
| 2010/0097759 A1 | 4/2010 | Leinen | |
| 2010/0124029 A1 | 5/2010 | Gaub | |
| 2010/0321889 A1 | 12/2010 | Yoshino | |
| 2011/0058337 A1 | 3/2011 | Han | |
| 2011/0078481 A1 | 3/2011 | Noda | |
| 2011/0188174 A1 | 8/2011 | Simper | |
| 2011/0194247 A1 | 8/2011 | Nakasaka | |
| 2011/0194249 A1 | 8/2011 | Nakasaka | |
| 2011/0273844 A1 | 11/2011 | Hernandez | |
| 2012/0024803 A1 | 2/2012 | Replogle | |
| 2012/0044083 A1 | 2/2012 | Molnar et al. | |
| 2012/0102715 A1 * | 5/2012 | Chin | F16B 3/00 29/525.01 |
| 2012/0169257 A1 | 7/2012 | Brereton | |
| 2012/0188712 A1 | 7/2012 | Ishibashi | |
| 2012/0199373 A1 | 8/2012 | Uchida | |

FOREIGN PATENT DOCUMENTS

| | | |
|---|---|---|
| DE | 10 2009 047 804 A1 | 3/2011 |
| DE | 10 2011 110 182 A1 | 2/2013 |
| EP | 0 200 516 | 11/1986 |
| EP | 1524890 A1 | 4/2005 |
| EP | 2 197 254 A1 | 6/2010 |
| EP | 2 421 344 A2 | 2/2012 |
| GB | 2223884 | 4/1990 |
| JP | 2000222007 | 8/2000 |
| WO | WO2013/166494 | 11/2013 |

OTHER PUBLICATIONS

Search report, dated Apr. 10, 2015, issued by Intellectual Property Office of Singapore in connection with Appln. No. 201309439-6, filed Dec. 19, 2013.

European Search Report, dated Mar. 16, 2016, in connection with EP14198080.5, filed Dec. 16, 2014.

* cited by examiner

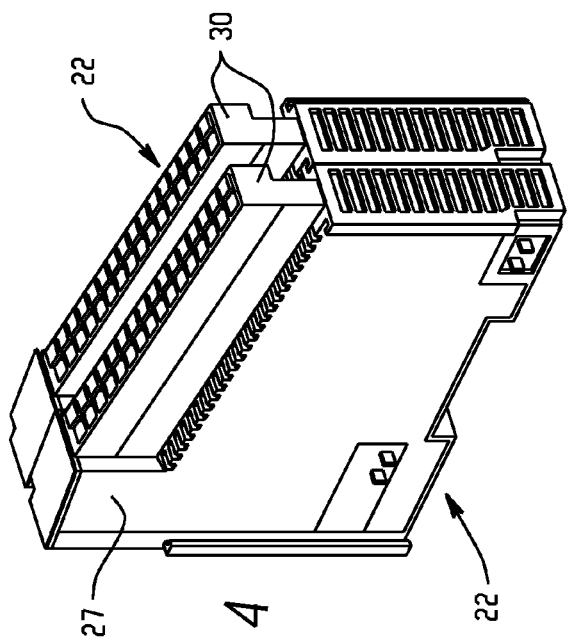
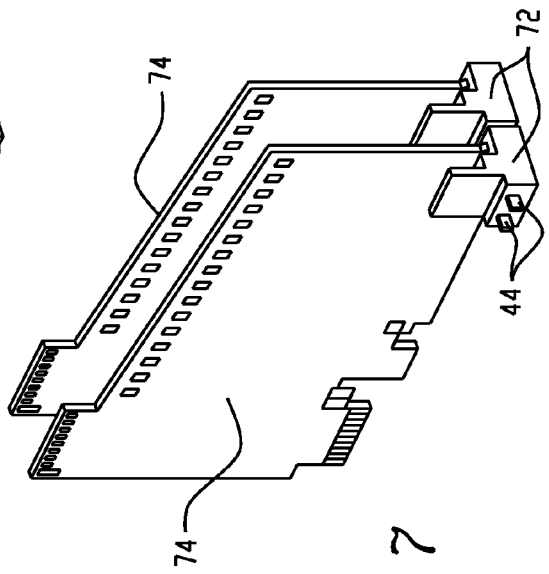
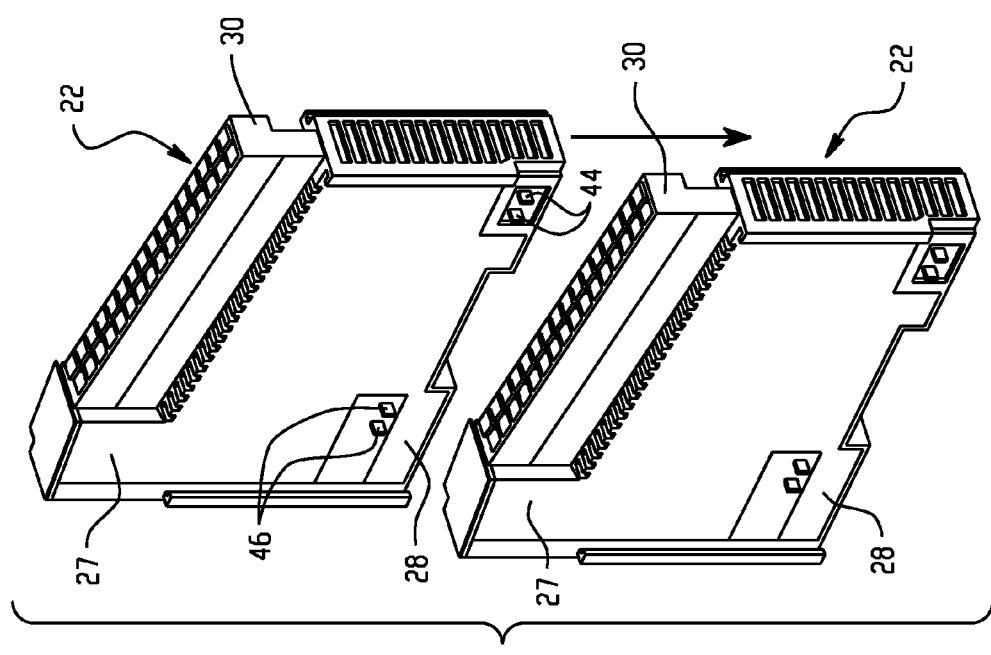
Fig. 4
Fig. 7
Fig. 3

SLICE I/O—FIELD POWER BUS BREAKER

BACKGROUND INFORMATION

The present exemplary embodiment relates generally to the field of automation control systems, such as those used in industrial and commercial settings. It finds particular application in conjunction with techniques for providing, accessing, configuring, operating, or interfacing with input/output (I/O) devices that are configured for coupling and interaction with an automation controller, and will be described with particular reference thereto. However, it is to be appreciated that the present exemplary embodiment is also amenable to other like applications.

Automation controllers are special purpose computers used for controlling industrial automation and the like. Under the direction of stored programs, a processor of the automation controller examines a series of inputs (e.g., electrical input signals to the automation controller) reflecting the status of a controlled process and changes outputs (e.g., electrical output signals from the automation controller) based on analysis and logic for affecting control of the controlled process. The stored control programs may be continuously executed in a series of execution cycles, executed periodically, or executed based on events. The inputs received by the automation controller from the controlled process and the outputs transmitted by the automation controller to the controlled process are normally passed through one or more I/O devices, which are components of an automation control system that serve as an electrical interface between the automation controller and the controlled process.

Traditional I/O devices typically include a base configured to couple the I/O device with a bus bar or the like, a terminal block for communicatively coupling the I/O device with field devices, and an I/O module that includes circuitry for performing communication functions and/or logic operations. In operation, a traditional I/O device typically communicatively couples with field devices (e.g., sensors and actuators) via terminals of the terminal block such that the I/O device can receive input signals from the field devices and provide output signals to the field devices.

In many applications, a large number of bases are arranged in close proximity to each other along a bus bar mounted on a wall or other surface. Each base supports both a terminal block and an I/O module. This type of configuration is sometimes referred to as a slice I/O because each set of bases, modules, and terminal blocks appear to be a "slice" of a larger structure.

Traditional automation control systems receive power from a power source (e.g., an electrical grid or battery) through field power distribution (FPB) modules, which are specialized modules for providing power to components of the automation control system. Depending on the size and nature of a particular automation control system, different numbers and types of field power distribution modules may be required. Indeed, as modules (e.g., I/O modules) are connected with a power bus of a modular automation controller system, the type or amount of power may need to be changed or augmented. For example, in traditional systems, a particular type of FPB module may be required for powering analog I/O, and a different type of FPB module may be required for powering discrete I/O. Additionally, a single FPB module can only support a limited number of automation control system modules or devices.

FPB modules break the field power distribution to downstream components. An FPB essentially comprises a terminal block and I/O module that is configured to break field power while passing on control power. A new field power source can be supplied via the terminal block such that downstream field power can be different than upstream field power. As such, an FPB module essentially bridges the control power between adjacent I/O modules, while shunting the field power and offering an input connection to a different field power source.

BRIEF DESCRIPTION

In accordance with an aspect of the present disclosure, an input/output (I/O) device for an automation control system comprises a device housing containing control circuitry, the device housing being mountable to a support, a control power input for receiving control power from a first adjacent I/O device when connected thereto, the control power input configured to supply control power to the control circuitry, a control power output for outputting control power to a second associated adjacent I/O device, a field power input for receiving field power from the first associated adjacent I/O device when connected thereto, and a field power output for transmitting field power to the second associated I/O device. The field power input is selectively removable to prevent field power from being received by the I/O device from the first associated adjacent I/O device when connected thereto.

The field power input can include a pair of blade connectors protruding from the housing via at least one opening, the pair of blade connectors configured to mate with corresponding connectors of a field power output of the first adjacent I/O device, the blade connectors being selectively removable from the device housing of the I/O device. The field power input can further comprise an input housing including a connector body therein, the connector body including at least one pair of cantilevered arms between which a blade connector is received, the connector body further comprising a threaded bore in which a removable fastener is received, the removable fastener being engaged with the blade to restrict removal of the blade from the input housing. The removable fastener can include a screw having a terminal end thereof engaged in a slot of the blade, whereby the terminal end of the screw restricts withdrawal of the blade from the connector body.

The input/output device can further include a cover for covering the opening in the device housing when the blade terminals are removed therefrom. The cover can extend around at least a portion of two adjacent side of the device housing. The device housing can have a relatively wide side and a relatively narrow side, and the cover can extend around at least a portion of both the relatively narrow side and the relatively wide side.

The input/output (I/O) device can also include a terminal block having an input for receiving a second source of field power, whereby the second source of field power is delivered to the field power output when the field power input is removed.

In accordance with another aspect, an automation control system comprising a plurality of I/O devices mounted to a support and connected in series, at least one of the I/O devices being a field power break (FPB) I/O device as described herein.

In accordance with another aspect, a method for selectively breaking field power distribution in an automation control system comprises providing at least one I/O device including a device housing mountable to a support, a control power input for receiving control power from a first adjacent associated I/O device, the control power input configured to supply control power to the control circuitry, a control power output for outputting control power to a second adjacent associated I/O device located opposite the first adjacent associated I/O device, a field power input for receiving field power from the first adjacent associated I/O device, and a field power output for transmitting field power to the second adjacent associated I/O device, wherein the field power input is selectively removable to prevent field power from being received by the I/O device from the first associated I/O device, and selectively removing the field power input from the I/O device to break field power distribution.

BRIEF DESCRIPTION OF THE DRAWINGS

FIG. 3 is a perspective view of a pair of exemplary I/O modules in accordance with the present disclosure;

FIG. 4 is perspective view of the I/O modules of FIG. 3 illustrated in coupled state;

FIG. 7 is a perspective view of a pair of I/O modules with their housings removed to show the selectively removable contact assemblies thereof;

DETAILED DESCRIPTION

Figure 1:
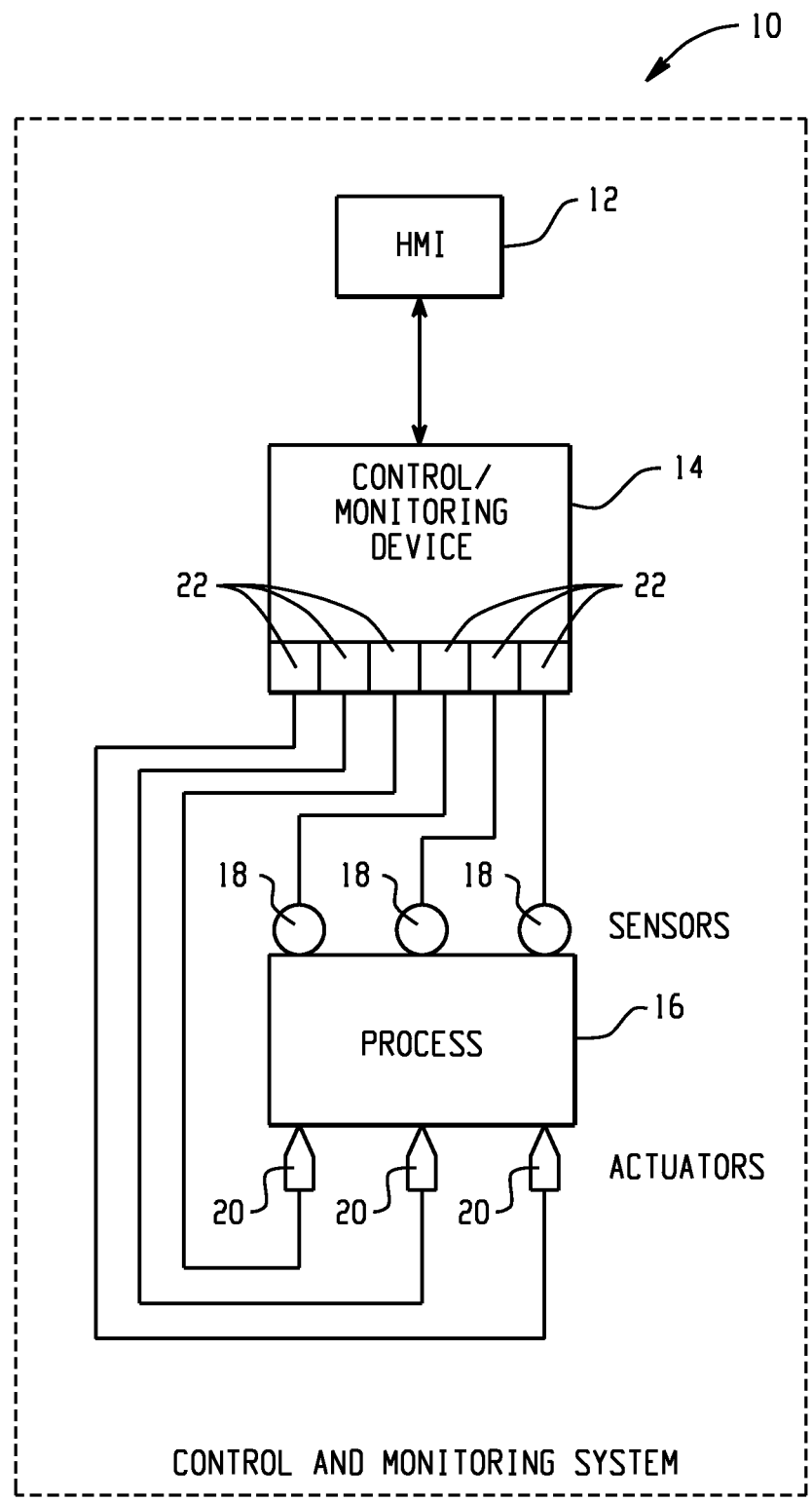
FIG. 1 is a diagrammatical representation of an exemplary control and monitoring system.

FIG. 1 is a diagrammatical representation of an exemplary control and monitoring system adapted to interface with networked components and configuration equipment in accordance with embodiments of the present techniques. The control and monitoring system is generally indicated by reference numeral 10. Specifically, the control and monitoring system 10 is illustrated as including a human machine interface (HMI) 12 and an automation controller or control/monitoring device 14 adapted to interface with components of a process 16.

The process 16 may take many forms and include devices for accomplishing many different and varied purposes. For example, the process 16 may comprise a compressor station, an oil refinery, a batch operation for making food items, a mechanized assembly line, and so forth. Accordingly, the process 16 may comprise a variety of operational components, such as electric motors, valves, actuators, temperature elements, pressure sensors, or a myriad of manufacturing, processing, material handling, and other applications. Further, the process 16 may comprise control and monitoring equipment for regulating process variables through automation and/or observation.

For example, the illustrated process 16 comprises sensors 18 and actuators 20. The sensors 18 may comprise any number of devices adapted to provide information regarding process conditions. The actuators 20 may include any number of devices adapted to perform a mechanical action in response to a signal from a controller (e.g., an automation controller). The sensors 18 and actuators 20 may be utilized to operate process equipment. Indeed, they may be utilized within process loops that are monitored and controlled by the control/monitoring device 14 and/or the HMI 12. Such a process loop may be activated based on process inputs (e.g., input from a sensor 18) or direct operator input received through the HMI 12.

As illustrated, the sensors 18 and actuators 20 are in communication with the control/monitoring device 14 and may be assigned a particular address in the control/monitoring device 14 that is accessible by the HMI 12. As illustrated, the sensors 18 and actuators 20 may communicate with the control/monitoring device 14 via one or more I/O devices 22 coupled to the control/monitoring device 14. The I/O devices 22 may transfer input and output signals between the control/monitoring device 14 and the controlled process 16. The I/O devices 22 may be integrated with the control/monitoring device 14, or may be added or removed via expansion slots, bays or other suitable mechanisms. For example, additional I/O devices 22 may be added to add functionality to the control/monitoring device 14. Indeed, if new sensors 18 or actuators 20 are added to control the process 16, additional I/O devices 22 may be added to accommodate and incorporate the new features functionally with the control/monitoring device 14. The I/O devices 22 serve as an electrical interface to the control/monitoring device 14 and may be located proximate or remote from the control/monitoring device 14, including remote network interfaces to associated systems.

The I/O devices 22 may include input modules that receive signals from input devices such as photo-sensors and proximity switches, output modules that use output signals to energize relays or to start motors, and bidirectional I/O modules, such as motion control modules which can direct motion devices and receive position or speed feedback. In some embodiments, the I/O devices 22 may convert between AC and DC analog signals used by devices on a controlled machine or process and DC logic signals used by the control/monitoring device 14. Additionally, some of the I/O devices 22 may provide digital signals to digital I/O devices and receive digital signals from digital I/O devices. Further, in some embodiments, the I/O devices 22 that are used to control machine devices or process control devices may include local microcomputing capability on an I/O module of the I/O devices 22.

In some embodiments, the I/O devices 22 may be located in close proximity to a portion of the control equipment, and away from the remainder of the control/monitoring device 14. In such embodiments, data may be communicated with remote modules over a common communication link, or network, wherein modules on the network communicate via a standard communications protocol. Many industrial controllers can communicate via network technologies such as Ethernet (e.g., IEEE802.3, TCP/IP, UDP, EtherNet/IP, and so forth), ControlNet, DeviceNet or other network protocols (Foundation Fieldbus (H1 and Fast Ethernet) Modbus TCP, Profibus) and also communicate to higher level computing systems.

Figure 2:
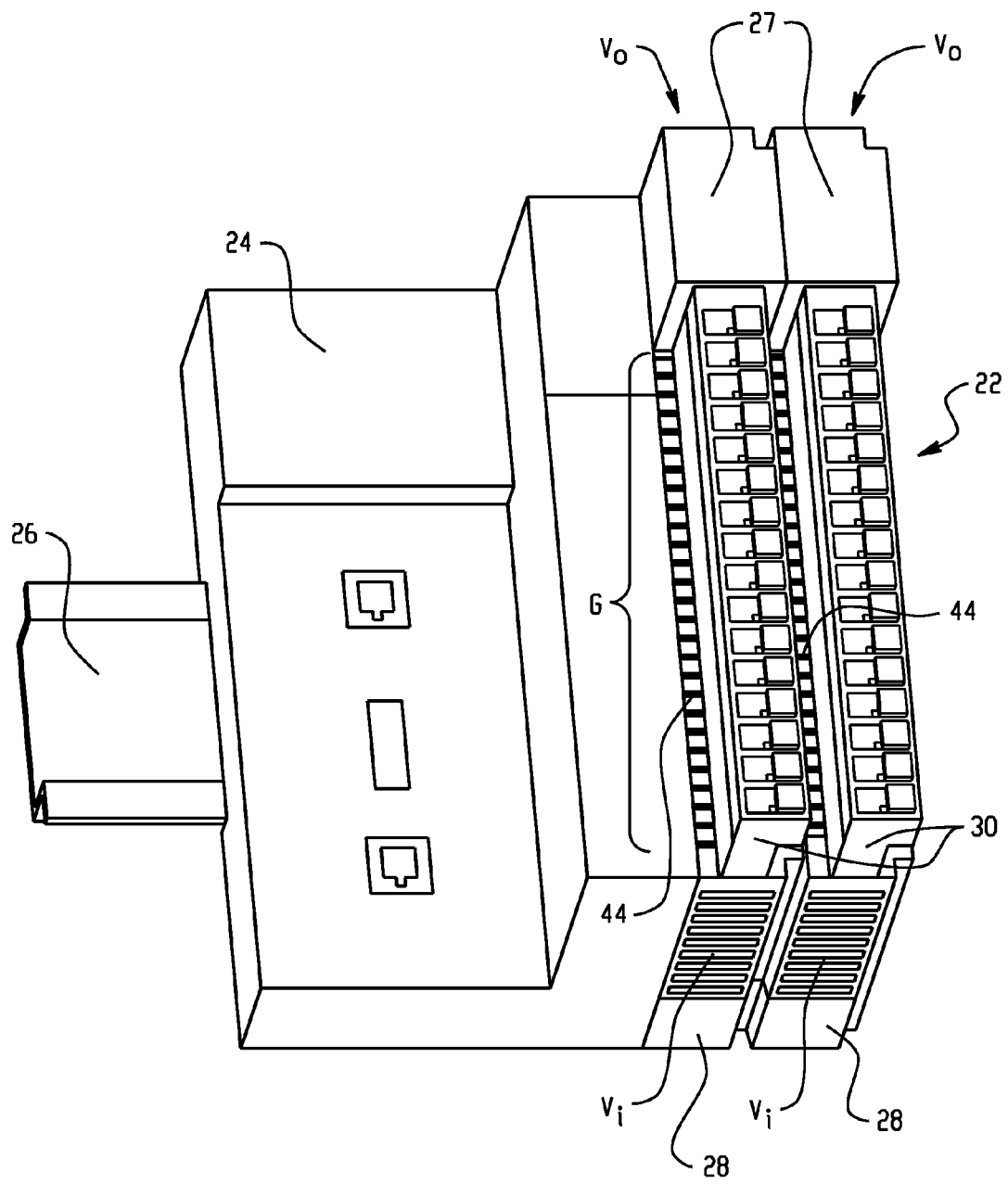
FIG. 2 is a perspective view of an I/O device in accordance with the present disclosure.

FIG. 2 is a perspective view of a plurality of I/O devices 22 connected to an I/O adapter 24 in accordance with embodiments of the present disclosure. Although only two I/O devices 22 are illustrated, it will be appreciated that any number of I/O devices can be used in accordance with the present disclosure. The I/O adapter 24 is configured to provide system power to the I/O devices 22, as well as to enable conversion between the communications protocols of the I/O devices 22 and the control/monitoring device 14. As illustrated, the I/O adapter 24 and the plurality of I/O devices 22 are mounted to a DIN rail 26, which is an industry standard support rail for mounting control equipment in racks and cabinets. The plurality of I/O devices 22 are electrically coupled in series along the DIN rail 26 such that field power and system information and power may be communicated between the I/O devices 22, and back through the I/O adapter 24 to the control/monitoring device 14. In other embodiments, the DIN rail 26 may be replaced with a different type of mounting structure. It will be appreciated that the I/O devices can be used in a wide variety of configurations, and the arrangement illustrated in FIG. 2 is merely exemplary in nature.

Each of the I/O devices 22 includes an I/O module 27 having a base portion 28 for physically and communicatively connecting the I/O device 22 to the DIN rail 26, the I/O adapter 24 and/or adjacent I/O devices 22. In addition, the base portion 28 of the I/O device 22 is configured to physically and communicatively connect the I/O device 22 with other I/O devices 22 via the DIN rail 26, field and system electrical contacts as described in greater detail below, base connection features as described in greater detail below, and so forth. In addition, each of the I/O devices 22 includes a terminal block 30 (which, in certain embodiments, may be removable from the base 28) for electrically connecting the I/O device 22 to field devices, such as the sensors 18 and actuators 20 illustrated in FIG. 1. As described in greater detail below, in certain embodiments, each terminal block 30 may include status indicators that are directly aligned with (e.g., adjacent to or directly integrated with) terminals of the terminal block 30. It will be appreciated that the I/O modules 27 include I/O control circuitry and/or logic. In general, the I/O modules 27 receive input signals from the field devices, deliver output signals to the field devices, perform general and/or specific local functionality on the inputs and/or outputs, communicate the inputs and/or outputs to the control/monitoring device 14 and/or the other I/O devices 22, and so forth.

As shown in FIGS. 3 and 4, adjacent I/O modules 27 are coupled together and/or to the DIN rail 26 (not shown in remaining figures) by sliding or otherwise bringing the components together in alignment. Respective pairs of blade terminals 44 and 46 mate with corresponding fork connectors (not shown in FIGS. 3 and 4, but described in more detail below) to electrically couple the downstream I/O module 27 (right I/O module in FIG. 4) with the upstream I/O module 27 (left I/O module in FIG. 4). Blade contacts 44 carry field power while blade contacts 46 carry control power.

As described above, in the past a FPB module would be interposed between the I/O device 22 when it was necessary to break the field power distribution therebetween.

Turning to FIGS. 5-11, and initially to FIG. 5, it will be appreciated that the I/O modules 27 of the present disclosure obviate the need for a FPB module to break field power distribution to downstream components by facilitating a break through a selectively removable contact system. The selectively removable contact system allows a system designer to selectively remove the contacts of an I/O module to isolate a downstream I/O module from its adjacent upstream counterpart. By providing an I/O module with selectively removable contacts, the present disclosure allows systems to be constructed without FPB modules thereby decreasing costs and simplifying the process.

Figure 5A:
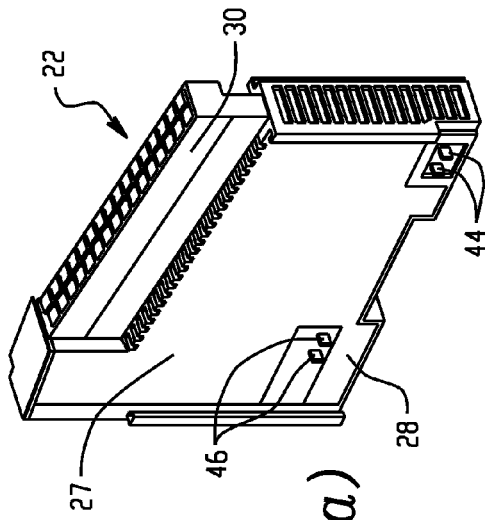
FIGS. 5(a)-5(d) are perspective views of an exemplary I/O module in various states during removal of the blade contacts and installation of the bus cap.
Figure 5B:
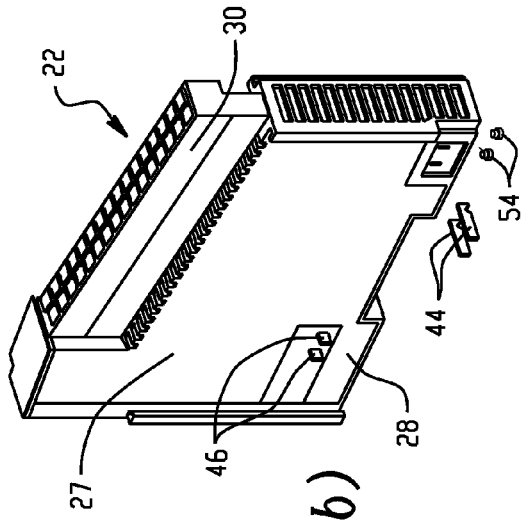
Figure 5C:
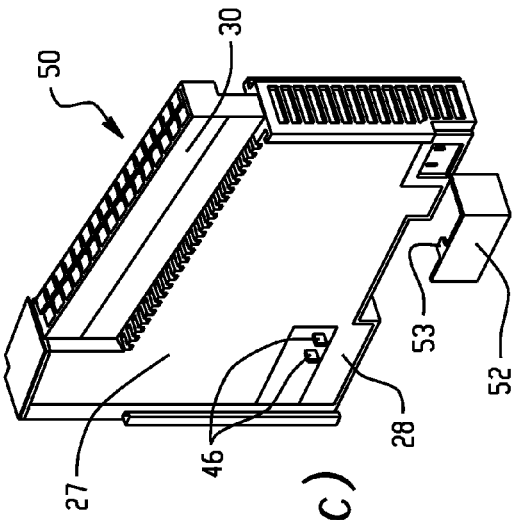
Figure 5D:
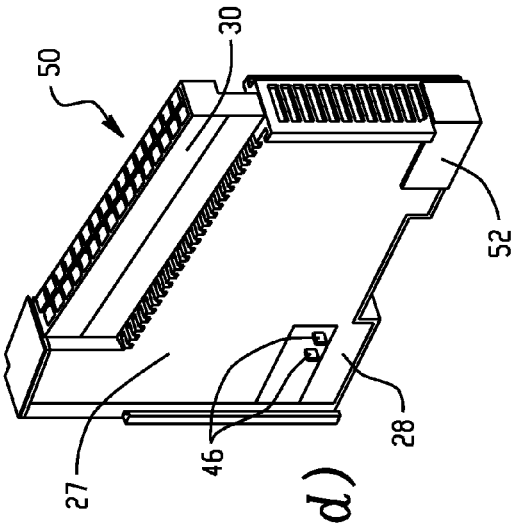

FIG. 5 illustrates an exemplary I/O module 27 in various states (a)-(d) as it is transformed from the state shown in FIG. 5(a) to the state shown in FIG. 5(d), which will be referred to herein as a field power break (FPB) I/O module, and designated with a new reference numeral 50. For clarity, the DIN rail and other components are not shown in the remaining figures. As will become apparent, the FPB field module 50 is outwardly identical to I/O module 27 except that the blade contacts 44 have been removed such that the field power is not passed to FPB I/O module 50 from an upstream I/O module 27. As will also be described, an optional bus cap 52 can be installed to provide a physical barrier between adjacent I/O modules, and to provide a visual indication that a given I/O module is an FPB module 50.

FIG. 5(a) illustrates an exemplary I/O device 22 including an I/O module 27 in accordance with the present disclosure. The I/O device 22 includes a terminal block mounted to the I/O module 27. Blade contacts 44 in the base portion 28 of the I/O module 27 are provided for connecting the I/O module 27 to an adjacent upstream I/O module in the manner described above.

In FIG. 5(b), the blade contacts 44 are illustrated separated from the base portion 28 of the I/O module 27. In this embodiment, screws 54 are used to retain the blade contacts 44 in the I/O module 27. As will be appreciated, other fasteners and/or retention mechanisms can be used to secure the blade contacts 44.

Once the blade contacts 44 are removed, a bus cap 52 can be installed over the opening in the base portion 28 from which the blade contacts 44 previously protruded. This is illustrated in FIGS. 5(c) and 5(d). The bus cap 52 will generally be made from an insulator material, such as plastic or the like. The bus cap 52 not only provides a barrier between the internal components of the I/O adaptor 24, but extends to a front edge of the I/O device 22 to serve as a visual indicator the I/O module is a FPB I/O module 50. This allows a system designer or technician to readily identify the FPB modules 50 by simply locating those I/O modules with a bus cap 52 installed. The bus cap 52, or portion thereof that is visible when installed, can be colored with a specific color to assist in identification. In the illustrated embodiment, the bus cap 52 includes a tab 53 that cooperates with a slot on the I/O adapter 24 to retain the bus cap 52 thereto.

Figure 6:
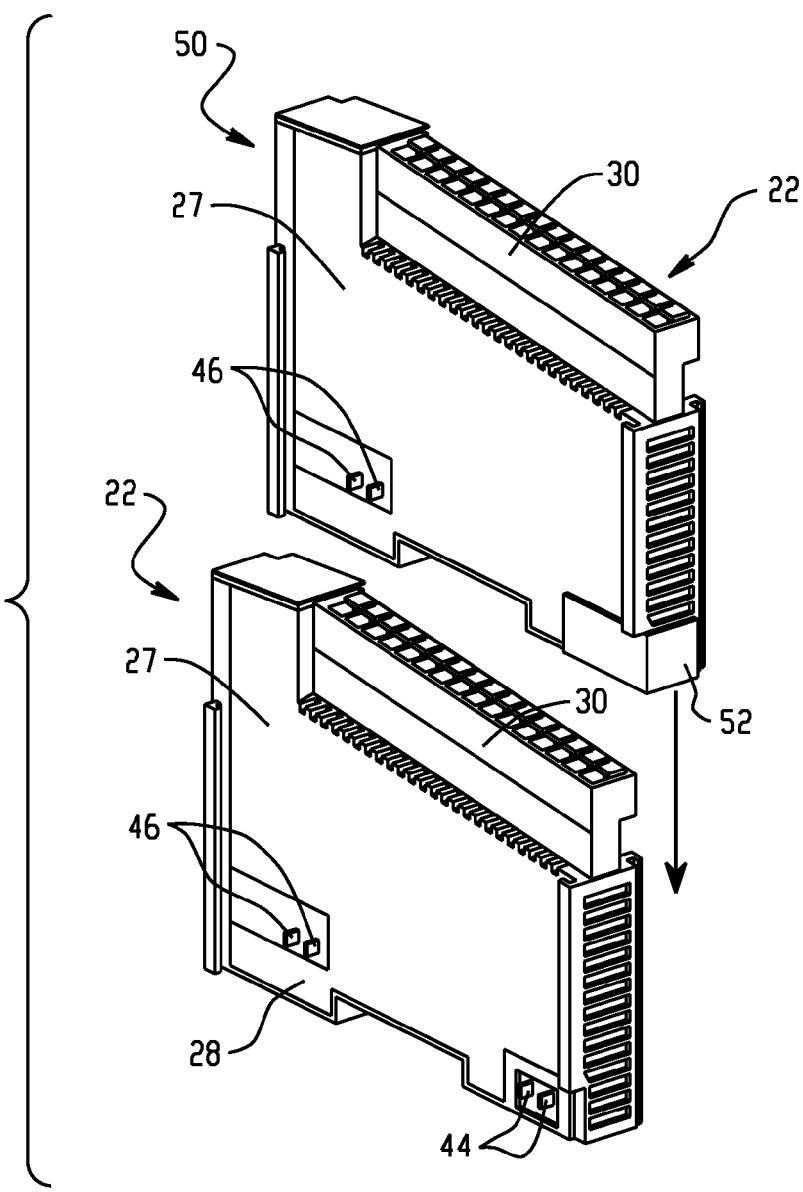
FIG. 6 is a perspective view of a field power break I/O module and an I/O module.

In FIG. 6, it will be appreciated that the FPB I/O module 50 can be installed adjacent I/O module 27 in an otherwise typical fashion. However, due to the removal of the blade contacts 44 and installation of the bus cap 52, no field power connection will be made between the modules.

Turning to FIGS. 7-11, an exemplary selectively removable contact assembly will be described. The selectively removable contact assembly generally comprises a power connector housing 72 that is configured to mate with a PCB 74 and includes the blade and fork contacts for making the field power connection between adjacent I/O modules as described above. In FIG. 7, two such circuit boards 74 and power connector housings 72 are illustrated in a connected fashion with the housings of each I/O module removed for clarity. In the remaining figures, the PCB 74 associated with each power connector housing is not shown for clarity.

Figure 8:
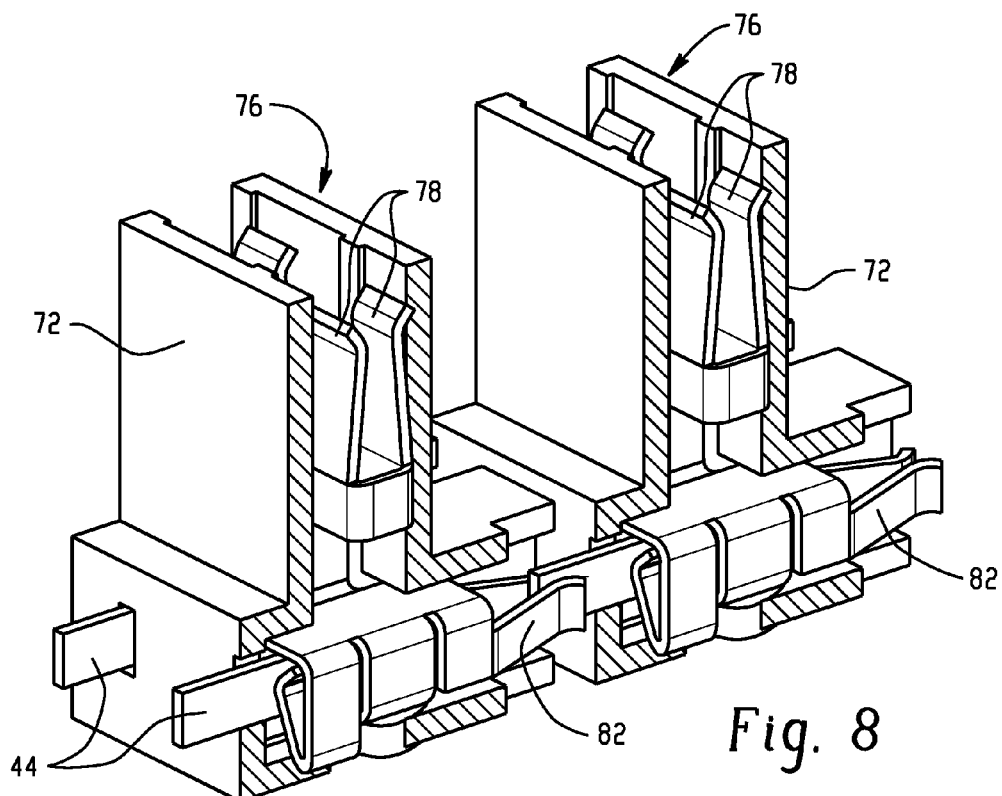
FIG. 8 is a perspective view of a pair of selectively removable contact assembly in a connected state.
Figure 9:
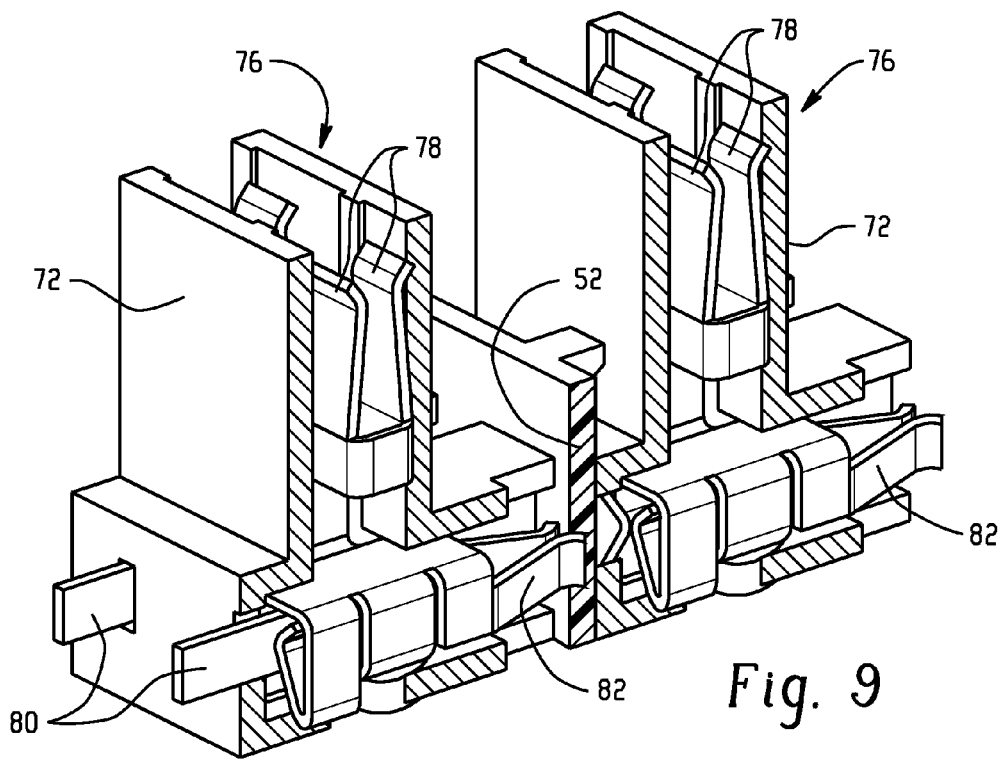
FIG. 9 is a perspective view of a pair of selectively removable contact assemblies wherein one of the assemblies has its contacts removed.

Turning to FIGS. 8 and 9, partial cutaway views illustrate a pair of power connector housings 72 in a physically coupled fashion. In FIG. 8, the power connector housings 72 are each associated with an I/O module 27 and thus field power connection is made between the I/O modules. In FIG.

9, the power connector housing on the right is associated with an FPB I/O module and thus no field power connection is made between the I/O modules.

In FIG. 8, each power connector housing 72 supports power connector main body 75 which includes a PCB connector 76 for electrically coupling with PCB 74. The PCB connector 76 in the illustrated embodiment includes cantilevered arms 78 for gripping and connecting with contacts of the PCB 74. The power connector main body 75 also includes a pair of blade and fork connectors 44 and 82 for coupling to the field power terminals of an adjacent I/O module. It will be appreciated that, in this embodiment, the blade connectors 44 are selectively removable and, as noted above, FIG. 9 illustrates a pair of power connector housings wherein the blade contacts 44 have been removed from the power connector housing 72 on the right, and a bus cap 52 has been installed between the power connector housings 72.

Figure 10:
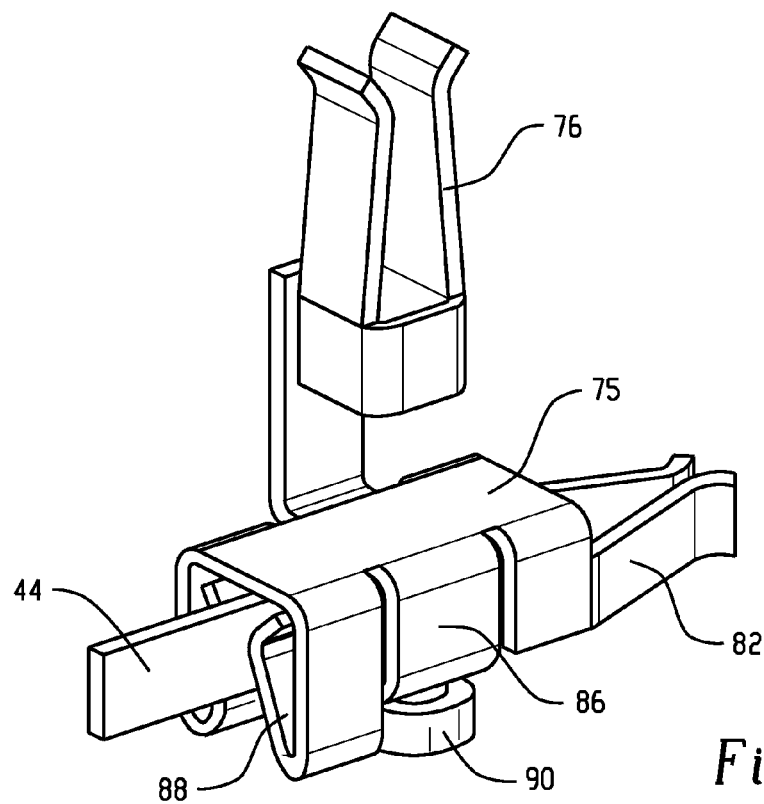
FIG. 10 is a perspective view of a power connector main body with a blade contact installed.
Figure 11:
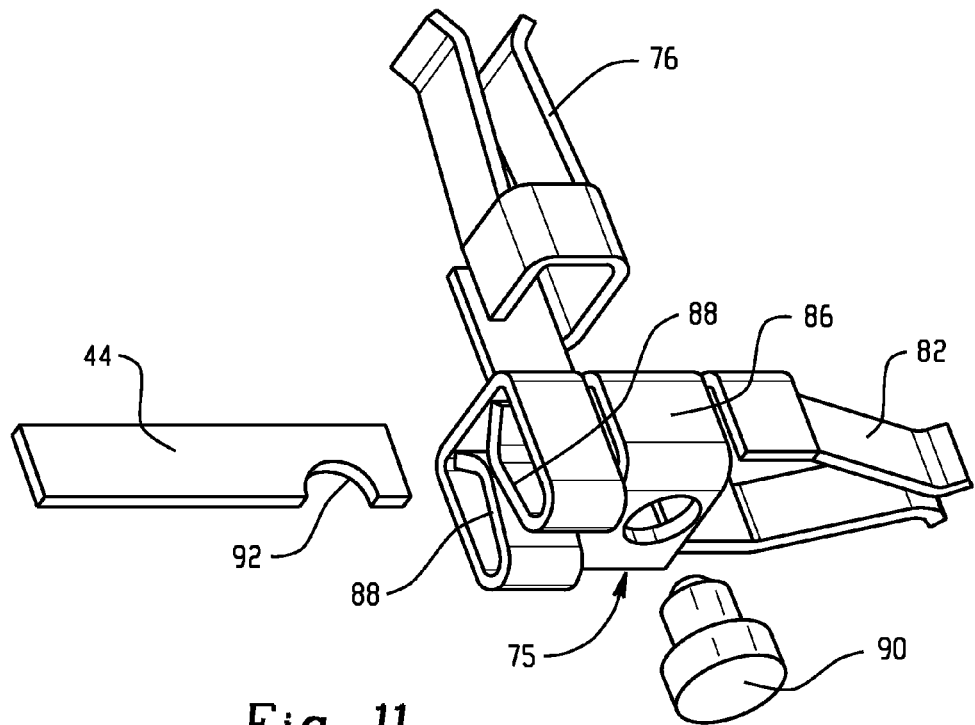
FIG. 11 is a perspective view of the power connector main body of FIG. 10 with the blade contact removed.

With reference to FIGS. 10 and 11, the power connector main body 75 and contacts are shown in isolation. The power connector main body 75 generally comprises a base portion 86 that is generally made of a conductive material such as a metal or metal alloy. Extending upwardly from the base portion is PCB connector 76 which, as noted, generally comprises a pair of cantilevered arms for compressive engaging a PCB. At one end of the base portion 86 are a pair of cantilevered arms comprising the fork connector 82, and at the opposite end is blade connector 44. A portion of blade connector 44 is supported between a pair of cantilevered arms 88 of the base portion 86 that define therebetween a slot. As best shown in FIG. 11, a screw 90 or other fastener is threaded or otherwise engaged with the base portion 86 to secure the blade 44 in the base portion 86. A leading end of the screw is configured to engage in a slot 92 of the blade connector 44 to restrict withdrawal of the blade connector 44 when installed.

It will be appreciated that in one embodiment, the power connector main body 75 can be formed as an integral piece such as by suitable stamping operations or the like, with only the blade connector 44 and the screw 90 being separate, selectively removable components. In addition, the blade connector 44 can be secured to the base portion 86 in other manners such as snapfit connections and the like.

This description uses examples to disclose the invention and also to enable any person skilled in the art to practice the invention, including making and using devices or systems and performing any incorporated methods. The patentable scope of the invention is defined by the claims and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The following is claimed:

1. An input/output (I/O) device for an automation control system, the I/O device comprising:
    a device housing containing control circuitry, the device housing being mountable to a support;
    a control power input for receiving control power from a first adjacent I/O device when connected thereto, the control power input configured to supply control power to the control circuitry;
    a control power output for outputting control power to a second associated adjacent I/O device;
    a field power input for receiving field power from the first associated adjacent I/O device when connected thereto; and
    a field power output for transmitting field power to the second associated I/O device;
    wherein the field power input is selectively removable to prevent field power from being received by the I/O device from the first associated adjacent I/O device when connected thereto.

2. The input/output (I/O) device of claim 1, wherein the field power input includes a pair of blade connectors protruding from the housing via at least one opening, the pair of blade connectors configured to mate with corresponding connectors of a field power output of the first adjacent I/O device, the blade connectors being selectively removable from the device housing of the I/O device.

3. The input/output (I/O) device of claim 2, wherein the field power input further comprises an input housing including a connector body therein, the connector body including at least one pair of cantilevered arms between which a blade connector is received, the connector body further comprising a threaded bore in which a removable fastener is received, the removable fastener being engaged with the blade to restrict removal of the blade from the input housing.

4. The input/output (I/O) device of claim 3, wherein the removable fastener includes a screw having a terminal end thereof engaged in a slot of the blade, whereby the terminal end of the screw restricts withdrawal of the blade from the connector body.

5. The input/output (I/O) device of claim 2, further comprising a cover for covering the opening in the device housing when the blade terminals are removed therefrom.

6. The input/output (I/O) device of claim 5, wherein the cover extends around at least a portion of two adjacent sides of the device housing.

7. The input/output (I/O) device of claim 6, wherein the device housing has a relatively wide side and a relatively narrow side, and the cover extends around at least a portion of both the relatively narrow side and the relatively wide side.

8. The input/output (I/O) device of claim 1, further comprising a terminal block having an input for receiving a second source of field power, whereby the second source of field power in delivered to the field power output when the field power input is removed.

9. An automation control system comprising a plurality of I/O devices mounted to a support and connected in series, at least one of the I/O devices being a field power break (FPB) I/O device including a device housing mountable to the common support, a control power input for receiving control power from a first adjacent I/O device, the control power input configured to supply control power to the control circuitry, a control power output for outputting control power to a second adjacent I/O device located opposite the first adjacent I/O device, a field power input for receiving field power from the first adjacent I/O device, and a field power output for transmitting field power to the second I/O device, wherein the field power input is selectively removable to prevent field power from being received by the I/O device from the first adjacent I/O device.

10. The automation control system of claim 9, wherein the at least one FPB I/O device includes a pair of blade connectors protruding from the housing via at least one opening, the pair of blade connectors configured to mate with corresponding connectors of a field power output of the first adjacent I/O device, the blade connectors being selectively removable from the device housing of the I/O device.

11. The automation control system of claim 10, wherein the field power input of the at least one FPB I/O device further comprises an input housing including a connector body therein, the connector body including at least one pair of cantilevered arms between which a blade connector is received, the connector body further comprising a threaded bore in which a removable fastener is received, the removable fastener being engaged with the blade to restrict removal of the blade from the input housing.

12. The automation control system of claim 11, wherein the removable fastener of the at least one FPB I/O device includes a screw having a terminal end thereof engaged in a slot of the blade, whereby the terminal end of the screw restricts withdrawal of the blade from the connector body.

13. The automation control system of claim 9, wherein the at least one FPB I/O device further comprises a cover for covering the opening in the device housing when the blade terminals are removed therefrom.

14. The automation control system of claim 13, wherein the cover extends around at least a portion of two adjacent sides of the device housing.

15. The automation control system of claim 13, wherein each of the plurality of I/O devices have housings with a relatively wide side and a relatively narrow side, the cover extending around at least a portion of both the relatively narrow side and the relatively wide side of the FPB I/O module such that the cover is visible from the narrow side thereby indication a field power break.

16. The automation control system of claim 9, wherein the at least one FPB I/O device further comprises a terminal block having an input for receiving a second source of field power, whereby the second source of field power can be delivered to the field power output when the field power input is removed.

17. A method for selectively breaking field power distribution in an automation control system comprising:
providing at least on I/O device including a device housing mountable to a support, a control power input for receiving control power from a first adjacent associated I/O device, the control power input configured to supply control power to the control circuitry, a control power output for outputting control power to a second adjacent associated I/O device located opposite the first adjacent associated I/O device, a field power input for receiving field power from the first adjacent associated I/O device, and a field power output for transmitting field power to the second adjacent associated I/O device, wherein the field power input is selectively removable to prevent field power from being received by the I/O device from the first associated I/O device; and
selectively removing the field power input from the I/O device to break field power distribution.

18. The method of claim 17, further comprising installing a cover in place of the field power input after removal thereof.

19. The method of claim 17, further comprising supplying an alternative field power to a terminal block of the I/O device, and supplying the alternative field power to the second adjacent associated I/O device via the field power output.

20. The method of claim 19, wherein the supplying the alternate field power to the terminal block includes supplying an AC or DC current.

* * * * *